(12) United States Patent
Yamashita

(10) Patent No.: US 9,799,594 B2
(45) Date of Patent: Oct. 24, 2017

(54) MICROSTRUCTURE, MULTILAYER WIRING BOARD, SEMICONDUCTOR PACKAGE AND MICROSTRUCTURE MANUFACTURING METHOD

(71) Applicant: FUJIFILM Corporation, Tokyo (JP)

(72) Inventor: Kosuke Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/219,803

(22) Filed: Jul. 26, 2016

(65) Prior Publication Data

US 2016/0336262 A1    Nov. 17, 2016

Related U.S. Application Data

(63) Continuation of application No. PCT/JP2015/051223, filed on Jan. 19, 2015.

(30) Foreign Application Priority Data

Jan. 27, 2014    (JP) .................................. 2014-012512

(51) Int. Cl.
*H01L 23/498*    (2006.01)
*H05K 1/11*    (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC ......... H01L 23/49838; H01L 23/49827; H01L 23/49894; H01L 21/4857; H01L 21/486;
(Continued)

(56) References Cited

U.S. PATENT DOCUMENTS 9,077,122 B2 *    7/2015    Hotta .................... G01R 1/0735
2008/0284042 A1 *    11/2008    Hotta ................. G01R 1/06755
257/775

FOREIGN PATENT DOCUMENTS

JP    52142774    * 11/1977
JP    2-119010 A    5/1990
(Continued)

OTHER PUBLICATIONS

Communication dated Nov. 22, 2016, from the Japanese Patent Office in counterpart application No. 2015-558838.
(Continued)

*Primary Examiner* — Timothy Thompson
*Assistant Examiner* — Charles Pizzuto
(74) *Attorney, Agent, or Firm* — Sughrue Mion, PLLC

(57) ABSTRACT

The present invention is to provide a microstructure capable of improving the withstand voltage of an insulating substrate while securing fine conductive paths, a multilayer wiring board, a semiconductor package, and a microstructure manufacturing method. The microstructure of the present invention has an insulating substrate having a plurality of through holes, and conductive paths consisting of a conductive material containing metal filling the plurality of through holes, in which an average opening diameter of the plurality of through holes is 5 nm to 500 nm, an average value of the shortest distances connecting the through holes adjacent to each other is 10 nm to 300 nm, and a moisture content is 0.005% or less with respect to the total mass of the microstructure.

7 Claims, 4 Drawing Sheets

(51) Int. Cl.
| | |
|---|---|
| *H01L 21/48* | (2006.01) |
| *H05K 3/40* | (2006.01) |
| *H05K 3/46* | (2006.01) |
| *H05K 1/02* | (2006.01) |
| *H05K 1/03* | (2006.01) |
| *H05K 3/36* | (2006.01) |
| *C25D 3/00* | (2006.01) |
| *C23C 18/00* | (2006.01) |
| *H05K 1/14* | (2006.01) |

(52) U.S. Cl.
CPC .. *H01L 23/49822* (2013.01); *H01L 23/49827* (2013.01); *H01L 23/49894* (2013.01); *H05K 1/0298* (2013.01); *H05K 1/0306* (2013.01); *H05K 1/115* (2013.01); *H05K 3/368* (2013.01); *H05K 3/4038* (2013.01); *H05K 3/4611* (2013.01); *C23C 18/00* (2013.01); *C25D 3/00* (2013.01); *H05K 1/144* (2013.01); *H05K 2201/042* (2013.01); *H05K 2201/10378* (2013.01); *H05K 2203/0315* (2013.01)

(58) Field of Classification Search
CPC ............ H01L 23/49822; H05K 1/0298; H05K 1/115; H05K 1/0306; H05K 3/4038; H05K 3/4611
USPC ........................................................ 174/258
See application file for complete search history.

(56) References Cited

FOREIGN PATENT DOCUMENTS

| JP | 10235784 A | 9/1998 |
|---|---|---|
| JP | 2008-270158 A | 11/2008 |
| JP | 2011-181350 A | 9/2011 |
| JP | 2012-84294 A | 4/2012 |
| JP | 2013-69629 A | 4/2013 |

OTHER PUBLICATIONS

International Preliminary Report on Patentability issued from the International Bureau in counterpart International application No. PCT/JP2015/051223, issued Aug. 11, 2016.
Denki Dendodo (Hiteiko), Tairiku Kaiteitei Dynamic Kenkyushitsu HP, Kobe University Graduate School, Chikyu Wakusei Kagaku Senko, Jul. 18, 2013, (retrieval date Mar. 20, 2015), corresponding URL: http://web.archive.org/web/20130718190057/http://www.re-search.kobe-u.ac.jp/fsci-marine/studies/survey/ca2.html.
International Search Report for PCT/JP2015/051223 dated Mar. 31, 2015.
Notification of Reason for Refusal, dispatched Aug. 8, 2017, issued in corresponding KR Application No. 10-2016-7015931, 14 pages in English and Japanese.

* cited by examiner

MICROSTRUCTURE, MULTILAYER WIRING BOARD, SEMICONDUCTOR PACKAGE AND MICROSTRUCTURE MANUFACTURING METHOD

CROSS-REFERENCE TO RELATED APPLICATIONS

This application is a Continuation of PCT International Application No. PCT/JP2015/051223 filed on Jan. 19, 2015, which claims priority under 35 U.S.C. §119(a) to Japanese Patent Application No. 2014-012512 filed on Jan. 27, 2014. The above application is hereby expressly incorporated by reference, in its entirety, into the present application.

BACKGROUND OF THE INVENTION

1. Field of the Invention

The present invention relates to a microstructure, a multilayer wiring board, a semiconductor package, and a microstructure manufacturing method.

2. Description of the Related Art

A microstructure provided with a plurality of conductive paths in an insulating substrate is used as an anisotropic conductive member in various electronic components.

An anisotropic conductive member, when disposed between an electronic component, such as semiconductor device or the like, and a circuit board and then subjected to merely the application of a voltage, is able to provide electrical connection between the electronic component and the circuit board. Accordingly, such members are widely used, for example, as electrically connecting members for connection of electronic components such as semiconductor devices and the like, and as inspection connectors for functional inspections of electronic components such as semiconductor devices and the like.

In recent years, with the increasing complication of wiring of electronic components, achieving miniaturization by forming conductive paths formed of an anisotropic conductive member with a small diameter and arranging the conductive paths with a narrow pitch has been proposed.

For example, JP2008-270158A discloses "an anisotropic conductive member in which, in an insulating substrate, a plurality of conductive paths consisting of a conductive member pass through the insulating substrate in the thickness direction in a state in which the conductive paths are insulated from each other and are provided in a state in which one end of each conductive path is exposed at one surface of the insulating substrate and the other end of each conductive path is exposed at the other surface of the insulating substrate, the density of the conductive paths is 2,000,000 pieces/mm² or more, and the insulating substrate is a structure consisting of an anodized film of an aluminum substrate having micropores (through holes)" ("Claim 1").

In addition, JP2013-069629A discloses "an anisotropic conductive member in which, in an insulating substrate, a plurality of conductive paths consisting of a conductive member pass through the insulating substrate in the thickness direction in a state in which the conductive paths are insulated from each other and are provided in a state in which one end of each conductive path protrudes from one surface of the insulating substrate and the other end of each conductive path protrudes from the other surface of the insulating substrate, the density of the conductive paths is 2,000,000 pieces/mm² or more, the insulating substrate is composed of an anodized film of an aluminum substrate having micropores (through holes), and a ratio (protrusion portion/through portion) between an average diameter of portions of the conductive paths protruding from the surface of the insulating layer substrate and an average diameter of portions of the conductive paths passing through the insulating layer substrate is 1.05 or greater" ("Claim 1").

SUMMARY OF THE INVENTION

However, fine conductive paths can be formed in the anisotropic conductive members disclosed in JP2008-270158A and JP2013-069629A, but it is difficult to secure insulation properties between conductive paths for recent electronic components with higher voltages. For example, in an anisotropic joint package in which power and signals are input and output to and from a semiconductor such as an integrated circuit (hereinafter, abbreviated as "IC") or the like through an anisotropic conductive member, an IC using a high drive voltage of 3 V or higher is frequently used. Further, in a power semiconductor, a high voltage of several tens to several hundreds of volts is used. Thus, there is a demand for electronic components with higher voltages to secure insulation properties between conductive paths.

An object of the present invention is to provide a microstructure capable of improving the withstand voltage of an insulating substrate while securing fine conductive paths, a multilayer wiring board, a semiconductor package, and a microstructure manufacturing method.

As a result of intensive investigations to solve the above problem, the present inventors have found that while securing fine conductive paths, the withstand voltage of an insulating substrate is improved by reducing the moisture content of a microstructure and have completed the present invention.

That is, it has been found that the above object can be achieved by adopting the following configurations.

(1) A microstructure comprising: an insulating substrate having a plurality of through holes; and conductive paths consisting of a conductive material containing metal filling the plurality of through holes, wherein an average opening diameter of the plurality of through holes is 5 nm to 500 nm, an average value of the shortest distances connecting the through holes adjacent to each other is 10 nm to 300 nm, and a moisture content is 0.005% or less with respect to the total mass of the microstructure.

(2) The microstructure according to (1), wherein the insulating substrate is an aluminum anodized film.

(3) The microstructure according to (1) or (2) that is used as an anisotropic conductive member.

(4) A multilayer wiring board comprising: the microstructure according to (3); and a pair of wiring boards disposed to sandwich the microstructure and electrically connected to each other through conductive paths.

(5) A semiconductor package using the multilayer wiring board according to (4).

(6) A microstructure manufacturing method comprising: a precursor forming step of providing a plurality of through holes having an average opening diameter of 5 nm to 500 nm in an insulating substrate such that an average value of the shortest distances connecting the through holes adjacent to each other is 10 nm to 300 nm, and then filling the plurality of through holes with a conductive material containing metal and forming conductive paths to obtain a precursor; and a baking treatment step of carrying out a baking treatment at a temperature of 100° C. or higher for 3 hours or longer after the precursor forming step to obtain a microstructure having a moisture content of 0.005% or less with respect to the total mass.

(7) The microstructure manufacturing method according to (6), wherein the baking treatment step is carried out in a pressure-reduced atmosphere having an oxygen concentration of 0.1% or less.

According to the present invention, it is possible to provide a microstructure capable of improving the withstand voltage of an insulating substrate while securing fine conductive paths, a multilayer wiring board, a semiconductor package, and a microstructure manufacturing method.

BRIEF DESCRIPTION OF THE DRAWINGS

FIG. 1A is a front view and FIG. 1B is a cross-sectional view as seen from cutting line Ib-Ib of FIG. 1A.

DESCRIPTION OF THE PREFERRED EMBODIMENTS

Hereinafter, the present invention will be described in detail.

The description of the constitution requirements to be described below is occasionally made on the basis of representative embodiments of the present invention, but the present invention is not limited to these embodiments.

The numerical range represented by the term "to" in the specification include the numerical values set forth before and after "to" as lower and upper limits, respectively.

[Microstructure]

A microstructure of the present invention has an insulating substrate having a plurality of through holes, and conductive paths consisting of a conductive material containing metal filling the plurality of through holes, in which an average opening diameter of the plurality of through holes is 5 nm to 500 nm, an average value of the shortest distances connecting the through holes adjacent to each other is 10 nm to 300 nm, and a moisture content is 0.005% or less with respect to the total mass of the microstructure.

The microstructure having such a configuration according to the present invention enables the withstand voltage of the insulating substrate to be improved while securing fine conductive paths.

That is, since the thickness of the insulating substrate which separates the conductive paths is reduced when miniaturization is achieved by forming the conductive paths of the microstructure to have a small diameter and arranging the conductive paths with a narrow pitch, even with a small amount of moisture included in the insulating substrate, a conduction path is formed, which causes damage in the insulation properties of the insulating substrate. Particularly, in the case in which the insulating substrate is composed of an anodized film, in the manufacturing step, for example, when anodization is carried out in an acidic liquid, when the plurality of through holes of the insulating substrate are filled with metal by an electroplating method to provide conductive paths, or when a washing treatment is carried out before and after each step, surplus moisture is contained in the surface or inside of the anodized film. Here, in the microstructure of the present invention, when the moisture content of the microstructure is controlled to 0.005% or less with respect to the total mass, a conduction path is prevented from being formed by moisture in the insulating substrate, which separates fine conductive paths, and thus the insulation resistance of the insulating substrate is significantly improved.

Next, the entire configuration of the microstructure of the present invention will be described using FIGS. 1A to 2, and then each configuration will be described in detail.

Figure 1A:
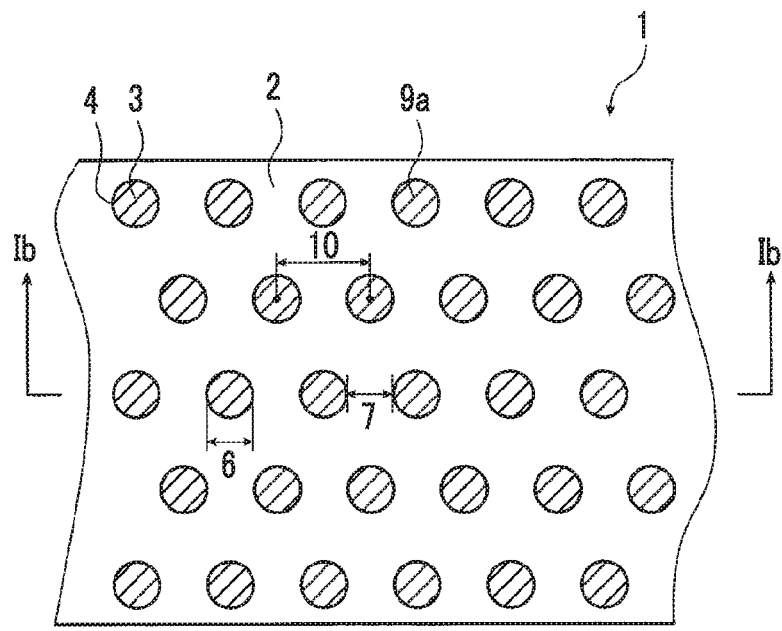
FIGS. 1A and 1B are schematic views showing an example of a preferable embodiment of a microstructure of the present invention.
Figure 1B:
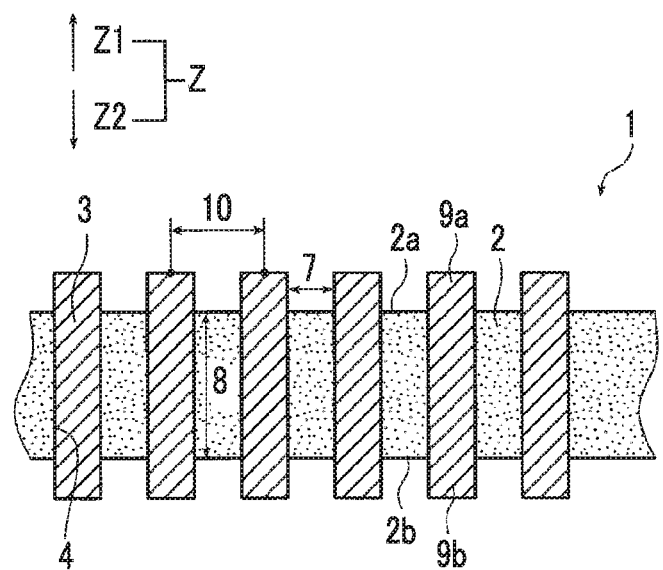

FIGS. 1A and 1B are schematic views showing an example of an embodiment of the microstructure of the present invention. FIG. 1A is a front view and FIG. 1B is a cross-sectional view as seen from cutting line Ib-Ib of FIG. 1A.

A microstructure 1 shown in FIGS. 1A and 1B has an insulating substrate 2, and a plurality of conductive paths 3 provided in the insulating substrate 2. The insulating substrate 2 has a plurality of through holes 4 passing through the insulating substrate in a thickness direction Z and the plurality of through holes 4 are filled with a conductive material containing metal to provide the plurality of conductive paths 3.

In the present invention, the moisture content of the microstructure 1 is 0.005% or less with respect to the total mass. In this manner, by reducing the moisture content of the microstructure 1, a conduction path is prevented from being formed by moisture in the insulating substrate 2, which separates the fine conductive paths 3, and the withstand voltage of the insulating substrate 2 can be improved while securing the fine conductive paths 3. In addition, the moisture content of the microstructure 1 is preferably 0.002% or less, more preferably 0.001% or less, and still more preferably 0.0001% or less with respect to the total mass. Thus, the withstand voltage of the insulating substrate 2 can be further improved.

Here, the moisture content of the microstructure 1 is obtained in such a manner that after the mass (mass before heating) of the microstructure 1 is measured, the microstructure 1 is heated at a temperature rising rate of 10° C./min under a nitrogen atmosphere, and the mass of the microstructure 1 (mass after heating) when the temperature reaches 150° C. is measured to calculate the moisture content based on [(mass before heating−mass after heating)/mass before heating]×100.

In addition, the mass before heating refers to mass measured after the microstructure 1 is left to stand for 10 days under the conditions of 23° C. and a relative humidity of 30% to 60%.

Figure 2:
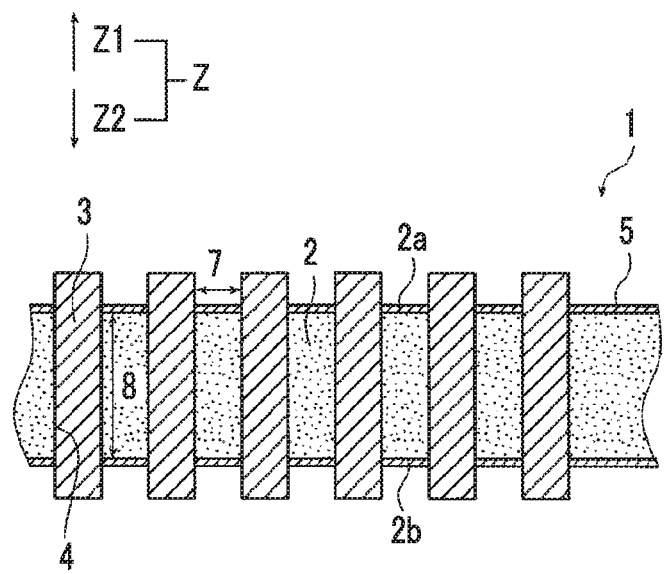
FIG. 2 is a cross-sectional view showing the configuration of a microstructure according to a modification example of the present invention.

As shown in FIG. 2, it is preferable that a hydrophobic film 5 is provided on respective surfaces 2a and 2b of the insulating substrate 2 in the microstructure 1. Accordingly, the moisture in the air is prevented from being adsorbed onto the microstructure 1 and thus the withstand voltage of the insulating substrate 2 can be maintained for a long period of time.

The plurality of conductive paths 3 are provided such that the plurality of through holes 4 are filled with the conductive paths from at least one surface 2a of the insulating substrate 2 to the other surface 2b. However, as shown in FIG. 1B, it is preferable that the conductive paths are provided in a state in which one end of each conductive path 3 protrudes from one surface 2a of the insulating substrate 2 and the other end of each conductive path 3 protrudes from the other surface 2b of the insulating substrate 2. That is, it is preferable that the conductive paths are provided such that both ends of each conductive path 3 respectively protrude from the surfaces 2a and 2b of the insulating substrate to the outside.

<Insulating Substrate>

The above-described insulating substrate is a structure having a plurality of through holes and is provided to secure insulation properties between the conductive paths, which will be described later.

In the present invention, the average opening diameter of the plurality of through holes (a portion represented by reference numeral 6 in FIG. 1A) is 5 nm to 500 nm and the average value of the shortest distances connecting through holes adjacent to each other (a portion represented by reference numeral 7 in FIGS. 1A and 1B) (average shortest distance) is 10 nm to 300 nm. By forming the conductive paths in the plurality of through holes, the conductive paths can be made fine and a multilayer wiring board, which will be described later, can be carefully applied to a wiring board with a plurality of conductive paths arranged in a complicated manner.

The average opening diameter of the plurality of through holes is preferably within a range of 20 nm to 400 nm and more preferably within a range of 20 nm to 200 nm.

Here, since the average shortest distance between adjacent through holes, that is, the thickness of the insulating substrate which separates the conductive paths, which will be described later, is as small as 10 nm to 300 nm, the moisture included in the insulating substrate forms a conduction path and thus the insulation properties are likely to be damaged. Particularly, because a conduction path is easily formed by moisture and the insulation properties of the insulating substrate are more likely to be damaged, the average shortest distance between adjacent through holes is preferably 10 nm to 250 nm, more preferably 20 nm to 200 nm, and still more preferably 30 nm to 150 nm. As described above, by controlling the moisture content of the microstructure to 0.005% or less with respect to the total mass, even when the average shortest distance between adjacent through holes is within a range of 10 nm to 300 nm, the insulation properties of the insulating substrate can be maintained at a high level and accordingly, a microstructure in which the withstand voltage of the insulating substrate is improved while fine conductive paths are secured can be obtained.

Here, the average opening diameter of the plurality of through holes refers to a value obtained by taking an image of the surface of the insulating substrate with a field emission scanning electron microscope (hereinafter, abbreviated as "FE-SEM") (at a magnification of 50,000 times), measuring opening diameters of 50 through holes, and calculating the average value thereof. In the case in which the shape of the opening portion of the through hole is not a perfect circle, the average opening diameter refers to a diameter of a perfect circle having the same area as the area of the opening portion (equivalent circle diameter).

In addition, the average shortest distance between the through holes refers to a value obtained by taking an image of the surface of the anodized film with FE-SEM (at a magnification of 50,000 times), measuring 50 shortest distances between the through holes, and calculating the average value thereof.

In addition, the thickness of the insulating substrate (a portion represented by reference numeral 8 in FIG. 1B) is preferably within a range of 1 µm to 1,000 µm, more preferably within a range of 5 µm to 500 µm, and still more preferably within a range of 10 µm to 300 µm. Thus, the insulation properties of the insulating substrate in the thickness direction can be more reliably secured.

Further, it is preferable that the insulating substrate is an aluminum anodized film. Aluminum oxide constituting the aluminum anodized film has an electrical resistivity of about $10^{14}$ Ω·cm similar to an insulating substrate (for example, a thermoplastic elastomer and the like) constituting a known anisotropic conductive film of the related art and the like and enables the withstand voltage of the insulating substrate to be more significantly improved.

The density of the plurality of through holes is preferably 2,000,000 holes/mm$^2$ or more, more preferably 10,000,000 holes/mm$^2$ or more, still more preferably 50,000,000 holes/mm$^2$ or more, and most preferably 100,000,000 holes/mm$^2$ or more. By controlling the density of the plurality of through holes within the above range, finer conductive paths can be formed in the insulating substrate.

In addition, from the viewpoint of more reliably preventing a conduction path from being formed by moisture between the conductive paths by uniformly reducing the moisture content of the microstructure and preventing stress from being partially ununiform, the degree of ordering of the plurality of through holes defined by the following expression (i) is preferably 50% or more, more preferably 70% or more, and still more preferably 80% or more.

$$\text{Degree of ordering (\%)}=B/A\times100 \qquad (i)$$

In the above expression (i), A represents the total number of through holes in the measurement range. B represents a number of the through holes within a measurement range in which in the case where a circle is drawn so as to be centered on a center of gravity of one through hole and so as to be of the shortest radius that is internally tangent to an edge of another through hole, the circle includes centers of gravity of six through holes other than the above-mentioned one through hole.

Figure 3A:
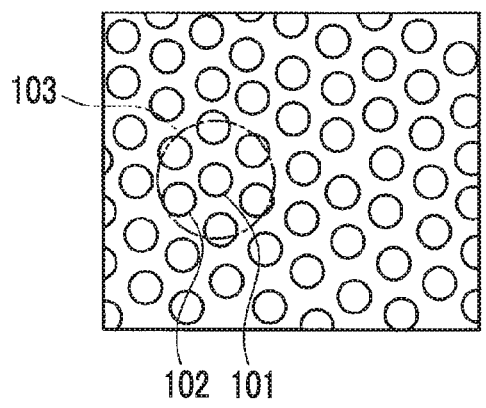
FIGS. 3A and 3B are views illustrating a method of calculating the degree of ordering of a plurality of through holes.
Figure 3B:
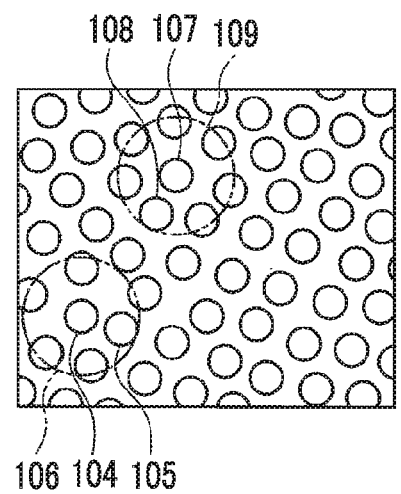

FIGS. 3A and 3B are views illustrating a method of calculating the degree of ordering of a plurality of through holes. Using FIGS. 3A and 3B, the above expression (i) will be described in more detail.

Regarding through holes 101 shown in FIG. 3A, in the case where a circle 103 is drawn so as to be centered on a center of gravity of one through hole 101 and so as to be of the shortest radius that is internally tangent to an edge of another through hole (internally tangent to an through hole 102), the circle 103 includes centers of gravity of six through holes other than the through hole 101. Accordingly, the through hole 101 is included in B.

Regarding through holes 104 shown in FIG. 3B, in the case where a circle 106 is drawn so as to be centered on a center of gravity of one through hole 104 and so as to be of the shortest radius that is internally tangent to an edge of another through hole (internally tangent to an through hole 105), the circle 106 includes centers of gravity of five through holes other than the through hole 104. Accordingly, the through hole 104 is not included in B.

In addition, regarding through holes 107 shown in FIG. 3B, in the case where a circle 109 is drawn so as to be centered on a center of gravity of one through hole 107 and so as to be of the shortest radius that is internally tangent to an edge of another through hole (internally tangent to an through hole 108), the circle 109 includes centers of gravity of seven through holes other than the through hole 107. Accordingly, the through hole 107 is not included in B.

Further, from the viewpoint of forming conductive path, which will be described later, to have a straight tube structure, the through holes do not have a branched structure, that is, a ratio between the number of through holes A per unit area of one surface of the anodized film and the number of through holes B per unit area of the other surface is preferably A/B=0.90 to 1.10, more preferably A/B=0.95 to 1.05, and particularly preferably A/B=0.98 to 1.02.

<Conductive Path>

The conductive paths are provided in the plurality of through holes of the insulating substrate and have a function of conducting electricity to the insulating substrate in the thickness direction.

The conductive material constituting the conductive paths contains at least a metal. This metal is not particularly limited as long as electricity can be conducted to the insulating substrate in the thickness direction. Preferable examples thereof include gold, silver, copper, aluminum, nickel, cobalt, tungsten, magnesium, and tin oxides doped with indium. Among these, in order to obtain a high conductivity of 20% IACS or higher expressed as a percentage (hereinafter, abbreviated as "% IACS") according to International Annealed Copper Standard (hereinafter, abbreviated as "IACS"), at least one selected from the group consisting of copper, gold, aluminum, nickel, cobalt, silver, and tungsten is preferable.

Here, the term % IACS refers to a ratio of conductivity when the conductivity with a volume resistivity of $1.7241 \times 10^{-2}$ μΩm is set to 100% IACS.

In the present invention, the length of the center line of the conductive path with respect to the thickness of the insulating substrate (length of conductive path/thickness of insulating substrate) is preferably 1.0 to 1.2 and more preferably 1.0 to 1.05. When the length of the center line of the conductive path with respect to the thickness of the insulating substrate is within the above range, the conductive path can be evaluated to have a straight tube structure and one to one response can be reliably obtained at both ends of the conductive path at the time when an electrical signal is applied to the conductive path. Thus, the anisotropic conductive member can be more preferably used as an inspection connector and an electrically connecting member for electronic components.

In addition, in the case in which both ends of the conductive path protrude from the both surfaces of the insulating substrate, the height of the protruding portions (portions represented by the reference numerals 9a and 9b in FIG. 1B, hereinafter, also referred to as "bumps") is preferably within a range of 0.1 nm to 100 nm, more preferably within a range of 1 nm to 50 nm, and particularly preferably within a range of 5 nm to 25 nm. When the height of the bump is within the above range, adhesion with an electrode (pad) portion of an electronic component can be improved.

In addition, the distance between the respective centers of the adjacent conductive paths (a portion represented by the reference numeral 10 in FIGS. 1A and 1B, hereinafter, also referred to as a "pitch") is preferably 5 nm to 500 nm, more preferably 10 nm to 200 nm, and still more preferably 30 nm to 150 nm. When the pitch is within the above range, a good balance between the diameter of the conductive path and the width between the conductive paths (insulating partition wall thickness) is easily achieved.

<Hydrophobic Film>

An arbitrary hydrophobic film that the microstructure of the present invention may have has a function of improving the hydrophobicity of the surface of the insulating substrate and preventing moisture from being adsorbed onto the insulating substrate.

The hydrophobic film is not particularly limited as long as the film improves hydrophobicity. However, a compound which functions as a surfactant having a low hydrophile-lipophile balance value (HLB value), specifically, a compound which functions as a surfactant having a HLB value of 9 or smaller is preferable.

Such a microstructure of the present invention can be preferably used as an anisotropic conductive member.

[Microstructure Manufacturing Method]

Hereinafter, the manufacturing method of the structure of the present invention will be described in detail.

The microstructure manufacturing method of the present invention includes a precursor forming step of providing a plurality of through holes having an average opening diameter of 5 nm to 500 nm in an insulating substrate such that an average value of the shortest distances connecting the through holes adjacent to each other is 10 nm to 300 nm, and then filling the plurality of through holes with a conductive material containing metal and forming conductive paths to obtain a precursor, and a baking treatment step of carrying out a baking treatment at a temperature of 100° C. or higher for 3 hours or longer after the precursor forming step to obtain a microstructure having a moisture content of 0.005% or less with respect to the total mass.

In addition, in the case in which the microstructure has an arbitrary hydrophobic film, the microstructure manufacturing method of the present invention has a hydrophobic treatment step of subjecting the surface of the precursor to a hydrophobic treatment after the precursor forming step and before the baking treatment step.

Next, the respective treatment steps in the microstructure manufacturing method of the present invention will be described in detail.

<Precursor Forming Step>

It is preferable that the precursor forming step includes an anodizing treatment step of subjecting a valve metal substrate to anodization, a perforating treatment step of making a plurality of pores, which are formed by the anodization, extend through the substrate to obtain an insulating substrate having a plurality of through holes having an average opening diameter of 5 nm to 500 nm and an average value of the shortest distances connecting the through holes adjacent to each other of 10 nm to 300 nm, after the anodizing treatment step, and a conductive path forming step of forming a conductive path by filling the plurality of through holes of the obtained insulating substrate with a conductive material containing metal to obtain a precursor, after the perforating treatment step.

[Valve Metal Substrate]

The valve metal substrate is not particularly limited as long as the insulation properties between the conductive paths can be secured in the insulating substrate. However, the valve metal substrate is preferably an aluminum substrate. Examples of the aluminum substrate include a pure aluminum substrate; alloy substrates including aluminum as a main component and trace amounts of other elements; substrates made of low purity aluminum (for example, recycled material) on which high purity aluminum is vapor-deposited; substrates such as silicon wafers, quartz, or glass whose surface is covered with high purity aluminum by a process such as vapor deposition or sputtering; and resin substrates on which aluminum is laminated.

In addition, of the aluminum substrate, the purity of aluminum of the surface on which an anodized film is to be provided by the anodizing treatment step, which will be described later, is preferably 99.5% by mass or higher, more preferably 99.9% by mass or higher, and still more preferably 99.99% by mass or higher. When the purity of aluminum is within the above range, the ordering of micropore arrangement is sufficient.

In addition, it is preferable that the surface of the aluminum substrate which is subjected to the anodizing treatment step, which will be described later, is subjected to a degreasing treatment and a mirror finishing treatment in advance.

Here, as a heat treatment, a degreasing treatment, and a mirror finishing treatment, the same treatments as each treatment described in paragraphs "0044" to "0054" of JP2008-270158A can be carried out.

[Anodizing Treatment Step]

The anodizing treatment step is a step of subjecting a valve metal substrate to an anodizing treatment to form an anodized film having a plurality of pores on the surface of the valve metal substrate.

The anodizing treatment in the manufacturing method of the present invention can employ known methods of the related art. However, from the viewpoint of increasing the ordering of pore arrangement and more reliably securing insulation properties in the plane direction, a self-ordering method and a constant voltage treatment are preferably used.

The average flow velocity of the electrolytic solution in the anodizing treatment is preferably 0.5 m/min to 20.0 m/min, more preferably 1.0 m/min to 15.0 m/min, and still more preferably 2.0 m/min to 10.0 m/min. By carrying out the anodizing treatment at the flow velocity in the above range, uniform and high ordering can be achieved.

The anodizing treatment can be carried out by, for example, a method of conducting electricity to the aluminum substrate as the anode in a solution having an acid concentration of 1% by mass to 10% by mass.

Solutions that may be used in anodizing treatment are preferably acid solutions. Sulfuric acid, phosphoric acid, chromic acid, oxalic acid, sulfamic acid, benzenesulfonic acid, amidosulfonic acid, glycolic acid, tartaric acid, malic acid, and citric acid are more preferable and among these, sulfuric acid, phosphoric acid, and oxalic acid are particularly preferable. These acids may be used singly or in combination of two or more.

The conditions for the anodizing treatment vary depending on the electrolytic solution used, and thus cannot be strictly specified. However, it is generally preferable for the electrolytic solution concentration to be 0.1% by mass to 20% by mass, the temperature of the solution to be −10° C. to 30° C., the current density to be 0.01 A/dm$^2$ to 20 A/dm$^2$, the voltage to be 3 V to 300 V, and the period of electrolysis to be 0.5 hours to 30 hours. It is more preferable for the electrolytic solution concentration to be 0.5% by mass to 15% by mass, the temperature of the solution to be −5° C. to 25° C., the current density to be 0.05 A/dm$^2$ to 15 A/dm$^2$, the voltage to be 5 V to 250 V, and the period of electrolysis to be 1 hour to 25 hours. It is still more preferable for the electrolytic solution concentration to be 1% by mass to 10% by mass, the temperature of the solution to be 0° C. to 20° C., the current density to be 0.1 A/dm$^2$ to 10 A/dm$^2$, the voltage to be 10 V to 200 V, and the period of electrolysis to be 2 hours to 20 hours.

Anodizing treatment is carried out for a period of preferably 0.5 minutes to 16 hours, more preferably 1 minute to 12 hours, and still more preferably 2 minutes to 8 hours.

Here, as a self-ordering method and a constant voltage treatment for the anodizing treatment, the same treatments as each treatment described in paragraphs "0056" to "0108" and FIGS. 3A to 3D of JP2008-270158A can be carried out.

[Perforating Treatment Step]

The perforating treatment step is a step of making a plurality of pores, which are formed by anodization, extend through the substrate to obtain an insulating substrate having a plurality of through holes after the anodizing treatment step.

Specific examples of the perforating treatment step include a method of dissolving the aluminum substrate and removing the bottom portion of the anodized film after the anodizing treatment step; and a method of cutting the aluminum substrate and the anodized film near the aluminum substrate after the anodizing treatment step.

For example, as these methods of the perforating treatment step, the same method as each method described in paragraphs "0110" to "0121" and FIGS. 3A to 4D of JP2008-270158A may be used.

[Conductive Path Forming Step]

The conductive path forming step is a step of filling the plurality of through holes of the obtained insulating substrate after the perforating treatment step with a conductive material including metal to form a plurality of conductive paths.

Here, the filling metal is the same as in the description of the above-described microstructure.

In addition, for example, as a method of filling the plurality of through holes with metal, the same methods as each method described in paragraphs "0123" to "0126" and FIGS. 4A to 4D of JP2008-270158A may be used.

[Surface Smoothing Treatment]

It is preferable that the manufacturing method of the present invention include a surface smoothing treatment step of making the front surface and the back surface smooth by a chemical mechanical polishing treatment and the like, after the conductive path forming step.

By carrying out a chemical mechanical polishing (CMP) treatment, the front surface and the back surface after the through holes are filled with metal can be made smooth while removing excess metal adhering to the surfaces.

The CMP treatment may be carried out using a CMP slurry such as PLANERLITE-7000 manufactured by Fujimi Inc., GPX HSC800 manufactured by Hitachi Chemical Co., Ltd., or CL-1000 manufactured by AGC Seimi Chemical Co., Ltd.

Since the anodized film is not polished, it is not preferable to use an interlayer insulating film and slurry for barrier metal.

[Trimming Treatment]

It is preferable that the manufacturing method of the present invention includes a trimming treatment step after the surface smoothing treatment step in the case of carrying out the conductive path forming step or carrying out the CMP treatment.

The trimming treatment step is a step of partially removing only the insulating substrate on the surface of the microstructure and making the conductive paths protrude after the surface smoothing treatment step in the case of carrying out the conductive path forming step or carrying out the CMP treatment.

Here, the trimming treatment can be carried out by bringing the bottom portion of the film into contact with an aqueous acid solution or an aqueous alkali solution used when the bottom portion of the above-described anodized film is removed under the condition of not dissolving metal constituting the conductive paths. As the contact method, for example, an immersion method and a spray method can be used. Particularly, it is preferable to use a phosphoric acid in the trimming treatment from the viewpoint of easily controlling the dissolving rate.

By carrying out such a precursor forming step, the plurality of through holes having an average opening diameter of 5 nm to 500 nm are provided in the insulating substrate such that the average value of the shortest distance connecting through holes adjacent to each other is 10 nm to 300 nm, and the plurality of through holes are filled with a conductive material containing metal to form conductive paths. Thus, a precursor can be obtained.

Here, the precursor forming step includes a step of exposing the insulating substrate to moisture. For example, anodization is carried out by immersing the aluminum substrate in an acid solution in the anodizing treatment step, the plurality of through holes of the insulating substrate are filled with metal by an electroplating method and the like in the conductive path forming step, and further, before and after the respective steps, a washing treatment is carried out. In this manner, by frequently exposing the insulating substrate to moisture in the precursor forming step, surplus moisture is included in the surface and inside of the insulating substrate.

In the present invention, the moisture contained in the insulating substrate in the precursor forming step is removed by the baking treatment step, which will be described later.

<Baking Treatment Step>

The baking treatment step is a step of carrying out a baking treatment at a temperature of 100° C. or higher for 3 hours or longer after the precursor forming step to obtain a microstructure having a moisture content of 0.005% or less with respect to the total mass.

The baking treatment step is preferably carried out by baking at the highest temperature of 150° C. or higher and thus the moisture content of the microstructure is remarkably reduced so that the withstand voltage of the insulating substrate can be more significantly improved. In addition, the baking treatment step is preferably carried out by baking the precursor at the highest temperature of 600° C. or lower and thus a microstructure can be prevented from being more significantly deteriorated by baking.

In addition, the baking treatment step is preferably carried out by a baking at the highest temperature of 100° C. or higher for 5 hours or longer and more preferably carried out by a baking at the highest temperature of 100° C. or higher for 10 hours or longer. Thus, the moisture content of the microstructure is remarkably reduced and the withstand voltage of the insulating substrate can be more significantly improved.

Further, even at the highest temperature, baking is preferably carried out for 10 minutes or longer and more preferably carried out for 1 hour or longer. For example, in the case of the highest temperature being 200° C., baking is preferably carried out for 1 hour or longer, more preferably carried out for 2 hours or longer, and still more preferably carried out for 3 hours or longer.

In addition, the baking treatment step is preferably carried out in a pressure-reduced atmosphere having an oxygen concentration of 0.1% or less and more preferably carried out in a pressure-reduced atmosphere having an oxygen concentration of 0.01% or less. Thus, the moisture content of the microstructure is remarkably reduced and the withstand voltage of the insulating substrate can be more significantly improved. Further, the conductive paths are prevented from being oxidized in the baking treatment and thus the conductivity of the conductive paths can be significantly improved.

Here, for example, as an apparatus used for making the pressure-reduced atmosphere, a general vacuum pump can be used.

<Hydrophobic Treatment Step>

The hydrophobic treatment step is a step of forming a hydrophobic film on the surface of the precursor after the precursor forming step.

Here, it is preferable that the hydrophobic treatment is carried out by applying a surfactant having a HLB value of 9 or smaller to the precursor.

The hydrophobic treatment by the application of a surfactant as described above is carried out by preparing a treatment solution by dissolving the surfactant, and applying the treatment solution to the precursor.

Examples of the application method of the treatment solution include a method of applying a treatment solution to a precursor and a method of immersing a precursor in a treatment solution.

For example, for such a hydrophobic treatment, a treatment method described in paragraphs "0079" to "0089" of JP2009-68076A may be used.

[Multilayer Wiring Board]

Hereinafter, a multilayer wiring board of the present invention will be described in detail.

The multilayer wiring board of the present invention has the above-described microstructure, and a pair of wiring boards disposed to sandwich the microstructure and electrically connected to each other through conductive paths.

Next, the configuration of the multilayer wiring board of the present invention will be described using FIGS. 4 and 5.

Figure 4:
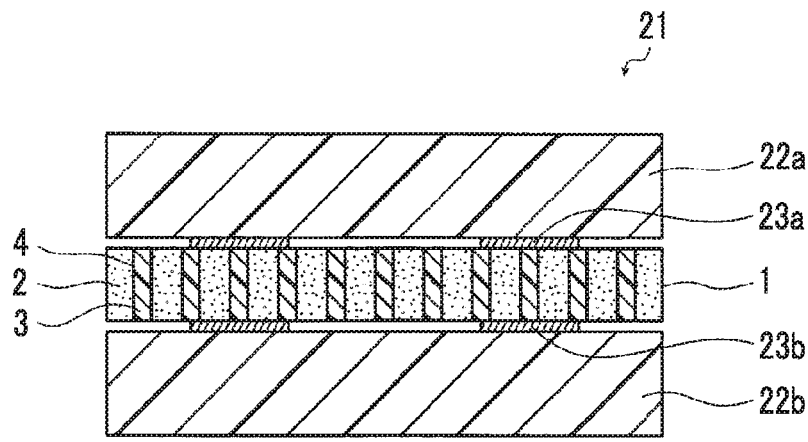
FIG. 4 is a schematic cross-sectional view showing an example of a preferable embodiment of a multilayer wiring board of the present invention.
Figure 5:
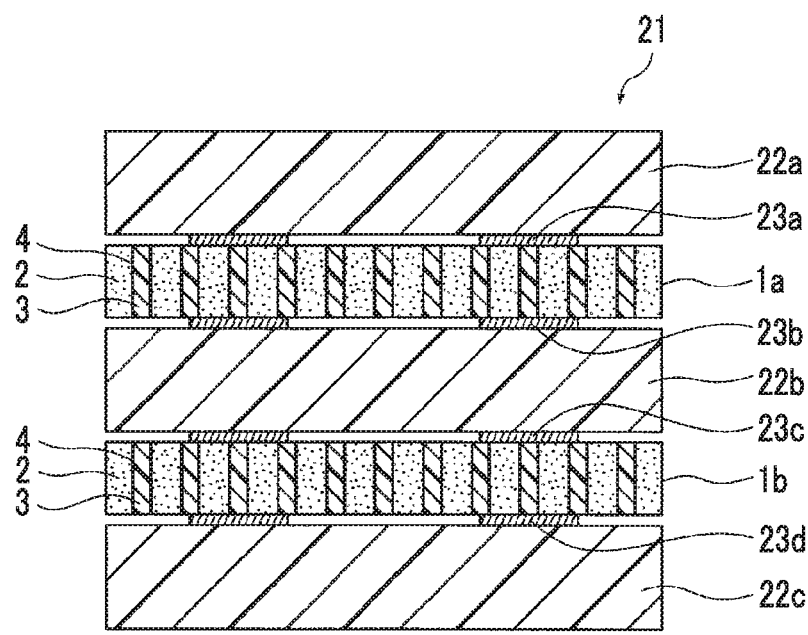
FIG. 5 is a cross-sectional view showing the configuration of a multilayer wiring board according to a modification example of the present invention.

FIG. 4 is a schematic cross-sectional view showing an example of a preferable embodiment of the multilayer wiring board of the present invention.

As shown in FIG. 4, a multilayer wiring board 21 has a microstructure 1 used as an anisotropic conductive member and a pair of wiring boards 22a and 22b disposed to sandwich the microstructure 1. In the microstructure 1, both ends of the conductive paths 3 disposed in the plurality of through holes 4 passing through the insulating substrate 2 in the thickness direction are respectively connected to an electrode 23a of the wiring board 22a and an electrode 23b of the wiring board 22b.

In addition, it is preferable that the multilayer wiring board 21 has a plurality of the microstructures 1 and a plurality of wiring boards 22, and the microstructures 1 and the wiring boards 22 are alternately laminated such that the plurality of wiring boards 22 are electrically connected to each other through the conductive paths 3 of the plurality of microstructures 1. For example, as shown in FIG. 5, the multilayer wiring board 21 is formed by alternately laminating two microstructures 1a and 1b, and three wiring boards 22a to 22c so that the wiring board 22a and the wiring board 22b can be electrically connected to each other through the conductive paths 3 of the microstructure 1a and the wiring board 22b and the wiring board 22c can be electrically connected to each other through the conductive paths 3 of the microstructure 1b. By laminating the plurality of wiring boards 22a to 22c in this manner, heat dissipation is enhanced and thus the reliability of the apparatus can be improved.

Here, in the present invention, since the moisture content of the microstructure is reduced 0.005% or less with respect to the total mass, a conduction path can be prevented from being formed by moisture in the insulating substrate, which separates fine conductive paths, and the withstand voltage of the insulating substrate can be improved while securing fine conductive paths. Thus, a plurality of conductive paths can be applied to a wiring board with complicated wiring and insulation properties between conductive paths can be secured in a wiring board with higher voltages.

Such a multilayer wiring board of the present invention can be preferably used for a semiconductor package.

Here, for example, as a semiconductor package, an embodiment having semiconductor devices on both surfaces of the above-described multilayer wiring board of the present invention may be mentioned.

The semiconductor device is not particularly limited and examples thereof include logic integrated circuits [for example, an application specific integrated circuit (ASIC), a field programmable gate array (FPGA), an application specific standard product (ASSP), and the like], microprocessors [for example, a central processing unit (CPU), a graphics processing unit (GPU), and the like], memories [for example, a dynamic random access memory (DRAM), a hybrid memory cube (HMC), a magnetoresistive random access memory (MRAM), a phase-change memory (PCM), a resistance random access memory (ReRAM), a ferroelectric random access memory (FeRAM), a flash memory, and the like], light emitting diodes (hereinafter, abbreviated as "LEDs") [for example, a microflash of a portable terminal, lighting for vehicles, a projector light source, LCD backlight, general lighting, and the like], power devices, analog integrated circuits [for example, a direct current (DC)-direct current (DC) connector, an insulated gate bipolar transistor (IGBT) and the like], micro electro mechanical systems (MEMS) [for example, an acceleration sensor, a pressure sensor, a vibrator, a gyro sensor, and the like], wireless [for example, a global positioning system (GPS), frequency modulation (FM), near field communication (NFC), a RF expansion module (RFEM), a monolithic microwave integrated circuit (MMIC), a wireless local area network (WLAN), and the like], discrete devices, complementary metal oxide semiconductors (CMOSs), CMOS image sensors, camera modules, passive devices, surface acoustic wave (SAW) filters, radio frequency (RF) filters, and integrated passive devices (IPDs).

EXAMPLES

Hereinafter, the present invention will be described in more detail based on examples. In the following examples, materials, used amounts, ratios, the details of treatments, and the treatment procedures may be suitably modified within the range not departing from the scope of the present invention. Accordingly, the range of the present invention should not be limitatively interpreted by examples described below.

Example 1

(A) Mirror Finishing Treatment (Electrolytic Polishing Treatment)

A high purity aluminum substrate (purity: 99.99% by mass, thickness: 0.4 mm, manufactured by Sumitomo Light Metal Industries, Ltd.) was cut to a size of 10 cm square that allows the substrate to be anodized, then subjected to an electrolytic polishing treatment using an electrolytic polishing solution having the following composition under the conditions of a voltage of 25 V, a solution temperature of 65° C., and a solution flow velocity of 3.0 m/min.

A carbon electrode was used as the cathode, and GP0110-30R (manufactured by Takasago, Ltd.) was used as the power supply. In addition, the flow velocity of the electrolytic solution was measured using the vortex flow monitor FLM22-10PCW manufactured by As One Corporation.

(Electrolytic Polishing Solution Composition)

85% by mass of Phosphoric acid (manufactured by Wako Pure Chemical Industries, Ltd.) 660 mL Pure water 160 mL Sulfuric acid 150 mL Ethylene glycol 30 mL (B) Anodizing Treatment Step After the electrolytic polishing treatment, the aluminum substrate was subjected to a preliminary anodizing treatment with an electrolytic solution of 0.20 mol/L sulfuric acid for 5 hours under the conditions of a voltage of 20 V, a solution temperature of 10° C., and a solution flow velocity of 3.0 m/min.

After the preliminary anodizing treatment, the aluminum substrate was then subjected to a film removal treatment in which it was immersed for 12 hours in a mixed aqueous solution (solution temperature: 50° C.) of 0.2 mol/L chromic anhydride and 0.6 mol/L phosphoric acid.

Next, the aluminum substrate was subjected to a re-anodizing treatment with an electrolytic solution of 0.20 mol/L sulfuric acid for 12 hours under the conditions of a voltage of 20 V, a solution temperature of 10° C., and a solution flow velocity of 3.0 m/min. Thus, an anodized film having a thickness of 100 μm was obtained.

The preliminary anodizing treatment and re-anodizing treatment were both carried out using a stainless steel electrode as the cathode and using GP0110-30R (manufactured by Takasago, Ltd.) as the power supply. In addition, NeoCool BD36 (manufactured by Yamato Scientific Co., Ltd.) was used as the cooling apparatus, and Pairstirrer PS-100 (manufactured by Tokyo Rikakikai Co., Ltd.) was used as the stirring and warming apparatus. The flow velocity of the electrolytic solution was measured using a vortex flow monitor FLM22-10PCW (manufactured by As One Corporation).

(C) Perforating Treatment Step

Next, the aluminum substrate was dissolved by immersion in a 20% by mass aqueous solution of mercuric chloride (corrosive sublimate) for 3 hours at 20° C., and the bottom portion of the anodized film was removed by immersion in 5% by mass phosphoric acid for 30 minutes at 30° C., thereby preparing a structure (insulating substrate) having a plurality of through holes.

(D) Heat Treatment

Next, the obtained structure was subjected to a heat treatment at a temperature of 400° C. for 1 hour.

(E) Electrode Film Forming Treatment

Next, a treatment of forming an electrode film on one surface of the anodized film after the heat treatment was carried out.

That is, an aqueous solution of 0.7 g/L chloroauric acid was applied to one surface, dried at 140° C. for 1 minute, and further baked at 500° C. for 1 hour to form gold plating nuclei.

Then, PRECIOUSFAB ACG2000 base solution/reducer solution (manufactured by Electroplating Engineers of Japan Ltd.) was used as the electroless plating solution to carry out immersion at 50° C. for 1 hour to thereby form an electrode film having no void.

(F) Conductive Path Forming Step

Next, an electroplating treatment was carried out by allowing a copper electrode to adhere to the surface on which the electrode film had been formed and using platinum as the anode while using the copper electrode as the cathode. Using a copper plating solution having the composition shown below, constant current electrolysis was carried out and thus a microstructure having the through holes filled with copper was prepared.

Here, a plating system manufactured by Yamamoto-MS Co., Ltd. and a power supply (HZ-3000) manufactured by Hokuto Denko Corp. were used to carry out constant current electrolysis. The deposition potential was checked by carrying out cyclic voltammetry in the plating solution and then the treatment was carried out under the conditions shown below.

<Copper Plating Solution Composition>
Copper sulfate 100 g/L
Sulfuric acid 50 g/L
Hydrochloric acid 15 g/L
Temperature 25° C.
Current Density 10 A/dm$^2$ (G) Surface Smoothing Treatment Step Next, a CMP treatment was carried out on the front and back surfaces of the metal-filled structure to polish the 15 μm-portions away from both the sides of the microstructure having a film thickness of 80 μm, thus removing the electrode film formed on the anodized film. The front and back surfaces of the anodized film were also made smooth to obtain a microstructure having a film thickness of 50 μm.

PLANERLITE-7000 manufactured by Fujimi Inc. was used as the CMP slurry.

The surface of the structure which has been subjected to the CMP treatment was observed by FE-SEM and it was found that the filling metal bulged out in part from the surface of the anodized film.

(H) Trimming Treatment

Next, after the e CMP treatment, the structure was immersed in a phosphoric acid solution so as to selectively dissolve the anodized film, thereby causing the columns of the filling metal filling the plurality of through holes to protrude from the anodized film to obtain a structure. The same phosphoric acid solution as in the above-described perforating treatment was used, and the treatment time was set to 5 minutes.

(I) Baking Treatment

Next, as shown in the first table below, the structure which has been subjected to the trimming treatment was baked at a highest temperature of 200° C. for 60 minutes in a pressure-reduced atmosphere having an oxygen concentration of 0.001%. At this time, the temperature of the baking treatment increased to the highest temperature of 200° C. for a temperature rising time of 60 minutes and maintained at the highest temperature of 200° C. for 60 minutes. Then, the temperature was dropped for a temperature falling time of 1,000 minutes. Thus, a microstructure held at a temperature of 100° C. or higher for 600 minutes was obtained.

It was confirmed that the average opening diameter of the through holes was 30 nm and the average shortest distance between the through holes was 33 nm by observing the image of the surface of the microstructure obtained in the above manner with FE-SEM (at a magnification of 50,000 times). Further, the microstructure was cut using a focused ion beam (hereinafter, abbreviated as a "FIB") and then the image of the cut surface thereof was observed with FE-SEM (at a magnification of 50,000 times). Then, it was confirmed that the thickness of the anodized film was 100 μm, the average height of the heights of the protruding portions (bump heights) of the conductive paths protruding from the surface of the anodized film was 10 nm. In addition, it was confirmed that the length of the center line of the conductive path with respect to the thickness of the anodized film (length of conductive path/thickness of anodized film) was 1.01.

Example 2

A microstructure was prepared in the same manner as in Example 1 except that the average opening diameter of the through holes was changed to 60 nm and the average shortest distance between the through holes was changed to 40 nm by carrying out the anodizing treatment step in the following manner.

(B) Anodizing Treatment Step

The aluminum substrate which has been subjected to the electrolytic polishing treatment was subjected to a preliminary anodizing treatment with an electrolytic solution of 0.50 mol/L oxalic acid for 5 hours under the conditions of a voltage of 40 V, a solution temperature of 15° C., and a solution flow velocity of 3.0 m/min.

After preliminary anodizing treatment, the aluminum substrate was then subjected to a film removal treatment in which it was immersed for 12 hours in a mixed aqueous solution (solution temperature: 50° C.) of 0.2 mol/L chromic anhydride and 0.6 mol/L phosphoric acid.

Next, the aluminum substrate was subjected to a re-anodizing treatment with an electrolytic solution of 0.50 mol/L oxalic acid for 10 hours under the conditions of a voltage of 40 V, a solution temperature of 15° C., and a solution flow velocity of 3.0 m/min. An anodized film having a film thickness of 80 μm was thus obtained.

The preliminary anodizing treatment and the re-anodizing treatment were both carried out using a stainless steel electrode as the cathode and using GP0110-30R (manufactured by Takasago, Ltd.) as the power supply. In addition, NeoCool BD36 (manufactured by Yamato Scientific Co., Ltd.) was used as the cooling apparatus, and Pairstirrer PS-100 (manufactured by Tokyo Rikakikai Co., Ltd.) was used as the stirring and warming apparatus. The flow velocity of the electrolytic solution was measured using the vortex flow monitor FLM22-10PCW (manufactured by As One Corporation).

The microstructure obtained after the baking treatment as in Example 1 was observed with FE-SEM and thus it was confirmed that the thickness of the anodized film was 80 μm, the average opening diameter of the through holes was 60 nm, and the average shortest diameter between the through holes was 40 nm.

Example 3

A microstructure was prepared in the same manner as in Example 1 except that the average opening diameter of the through holes was changed to 150 nm and the average shortest diameter between the through holes was changed to 150 nm by carrying out a re-anodizing treatment with an electrolytic solution of 0.50 mol/L malonic acid for 18 hours under the conditions of a voltage of 115 V and a solution temperature of 3° C. in the anodizing treatment step instead of using sulfuric acid.

Examples 4, 5, 7 and 8

Microstructures were prepared in the same manner as in Example 1 except that the conditions for the baking treatment were changed as shown in the first table.

Example 6

A microstructure was prepared in the same manner as in Example 1 except that after the trimming treatment, the structure was immersed in a hydrophobic treatment solution having the following composition for 5 minutes and then baked to remove moisture contained in the insulating substrate and the solvent of the hydrophobic treatment solution by volatilization and thus a hydrophobic film functioning as a surfactant on the surface of the structure was provided.
<Hydrophobic Treatment Solution>
GO-4 (tetraoleic acid polyoxyethylene sorbitol, HLB value=8.5, manufactured by Nikko Chemicals Co., Ltd.) 0.025 g
Methyl ethyl ketone 30.00 g

Example 9

A microstructure was prepared in the same manner as in Example 1 except that in the conductive path forming step, constant current electrolysis was carried out using a nickel plating solution having the composition shown below and the through holes were filled with nickel to form conductive paths.
<Nickel Plating Solution Composition>
Nickel sulfate 300 g/L
Nickel chloride 60 g/L
Boric acid 40 g/L
Temperature 50° C.
Current density 5 A/dm$^2$

Example 10

A microstructure was prepared in the same manner as in Example 1 except that except that in the conductive path forming step, potential scanning electrolysis was carried out using a 20% by mass sodium gold chloride solution held at 60° C. as an electrolyte and the through holes were filled with gold to form conductive paths.

Here, the potential scanning electrolysis was carried out in such a manner that using a plating system manufactured by Yamamoto-MS Co., Ltd. and a power supply (HZ-3000) manufactured by Hokuto Denko Corp, the deposition potential was checked by carrying out cyclic voltammetry in the plating solution and then the potential on the coating film side was changed from 0 V to 2 V in phases. The potential change rate was 0.5 mV/sec and the total electrolysis treatment time was 4,000 seconds.

Comparative Example 1

A microstructure was prepared in the same manner as in Example 1 except that the baking treatment was not carried out.

Comparative Example 2

A microstructure was prepared in the same manner as in Example 2 except that the baking treatment was not carried out.

Comparative Examples 3 and 5

Microstructures were prepared in the same manner as in Example 1 except that the conditions for the baking treatment were changed as shown in the first table.

Comparative Example 4

A microstructure was prepared in the same manner as in Example 3 except that the conditions for the baking treatment were changed as shown in the first table.

TABLE 1

First Table

| | Condition for baking treatment | | | | | | |
|---|---|---|---|---|---|---|---|
| | Atmosphere | Oxygen concentration [%] | Highest temperature [° C.] | Highest temperature maintaining time [min] | Temperature rising time [min] | Temperature falling time [min] | Holding time at 100° C. or higher [min] |
| Example 1 | Reduced pressure | $10^{-3}$ | 200 | 60 | 60 | 1,000 | 600 |
| Example 2 | Reduced pressure | $10^{-3}$ | 200 | 60 | 60 | 1,000 | 600 |
| Example 3 | Reduced pressure | $10^{-3}$ | 200 | 60 | 60 | 1,000 | 600 |
| Example 4 | Reduced pressure | $10^{-3}$ | 120 | 60 | 60 | 1,000 | 300 |
| Example 5 | Reduced pressure | $10^{-3}$ | 200 | 60 | 60 | 1,000 | 300 |
| Example 6 | Reduced pressure | $10^{-3}$ | 200 | 60 | 60 | 1,000 | 600 |
| Example 7 | Reduced pressure | $10^{-3}$ | 200 | 200 | 10 | 10 | 210 |
| Example 8 | Air | 15 | 200 | 200 | 10 | 10 | 210 |
| Example 9 | Reduced pressure | $10^{-3}$ | 200 | 60 | 60 | 1,000 | 600 |
| Example 10 | Reduced pressure | $10^{-3}$ | 200 | 60 | 60 | 1,000 | 600 |
| Comparative Example 1 | — | — | — | — | — | — | — |
| Comparative Example 2 | — | — | — | — | — | — | — |
| Comparative Example 3 | Air | 15 | 200 | 60 | 10 | 10 | 70 |
| Comparative Example 4 | Air | 15 | 200 | 60 | 10 | 10 | 70 |
| Comparative Example 5 | Nitrogen | 1 | 200 | 60 | 10 | 10 | 70 |

Here, the average opening diameter of the plurality of through holes formed in the prepared microstructures was obtained by taking an image of the surface of the anodized film with FE-SEM (at a magnification of 50,000 times), measuring opening diameters of 50 through holes, and calculating the average value thereof. The results are shown in the second table below.

In addition, the average shortest distance between the through holes formed in the prepared microstructures was obtained by taking an image of the surface of the anodized film with FE-SEM (at a magnification of 50,000 times), measuring 50 shortest distances between through holes, and calculating the average value thereof. The results are shown in the second table below.

In addition, the average bump height of the conductive paths formed in the prepared microstructures was obtained by cutting the microstructure with FIB and then taking an image of the cross section of the anodized film with FE-SEM (at a magnification of 50,000 times), measuring 50 bump heights, and calculating the average value thereof. The results are shown in the second table below.

Further, the moisture content of each of the prepared microstructures was obtained by leaving the microstructure under the conditions of 23° C. and a relative humidity of 30% to 60% for 10 days and then measuring the mass of the microstructure (mass before heating), then heating the microstructure at a temperature rising rate of 10° C./min under a nitrogen atmosphere using Q500 type calorimeter measuring apparatus (manufactured by TA Instruments Japan Inc.), measuring the mass of the microstructure (mass after heating) when the temperature reached 150° C., and calculating the content based on [(mass before heating−mass after heating)/mass before heating]×100. The results are shown in the second table below.

In the second table below, "-" means that a hydrophobic film is not formed on the surface of the insulating substrate.

probes P using probers (NANOPROBER NE-4000, manufactured by Hitachi High-Technologies Corporation) into contact with conductive paths 500 nm separated from each other, gradually increasing the voltage to be applied, and measuring the voltage value when the current flowed out with a semiconductor device analyzer (B1500A, manufactured by Agilent Technologies Japan, Ltd.). The results are shown in the third table below.

The lowest withstand voltage of the insulating substrate subjected to a high temperature high humidity storage treatment was obtained by subjecting the prepared microstructures to a high temperature high humidity storage treatment, bringing a pair of probes P using probers (NANOPROBER NE-4000, manufactured by Hitachi High-Technologies Corporation) into contact with conductive paths 500 nm separated from each other, gradually increasing the voltage to be applied, and measuring the voltage value when the current flowed out with a semiconductor device analyzer (B1500A, manufactured by Agilent Technologies Japan, Ltd.) in the same manner. Here, the high temperature high humidity storage treatment was carried out by leaving the microstructure under the environment of a temperature of 85° C. and a relative humidity of 85% RH for 100 hours. The result is shown in the third table below.

In the third table below, "-" means that the lowest withstand voltage of the insulating substrate subjected to a high temperature high humidity storage treatment was not measured.

The conductivity of the conductive path was obtained by measuring the volume resistivity of the conductive path, and calculating a ratio of the measurement value when a volume resistivity of $1.7241 \times 10^{-2}$ μΩm based on IACS was set to a conductivity of 100% IACS. The result is shown in the third table below.

Figure 7:
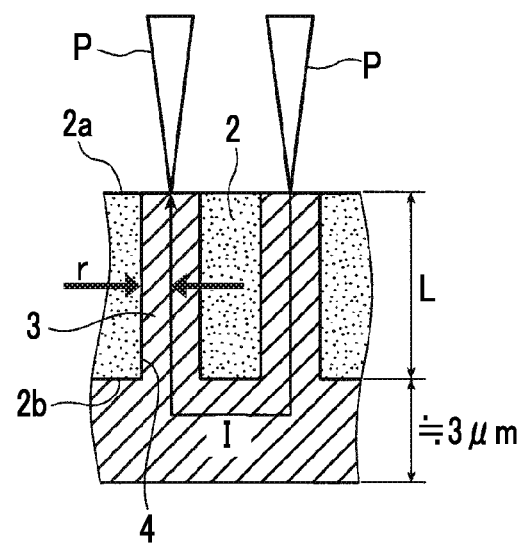
FIG. 7 is a view illustrating a method of measuring the conductivity of conductive paths.

Here, as shown in FIG. 7, the volume resistivity of the conductive path was obtained by preparing an electrode

TABLE 2

Second Table

| | | Insulating substrate | | | |
|---|---|---|---|---|---|
| | Conductive path Type of metal | Average opening diameter of through holes [nm] | Average shortest distance between through holes [nm] | Average bump height of through holes [nm] | Material of hydrophobic film | Moisture content of microstructure [%] |
| Example 1 | Cu | 30 | 33 | 10 | — | <0.0001 |
| Example 2 | Cu | 60 | 40 | 10 | — | <0.0001 |
| Example 3 | Cu | 150 | 150 | 10 | — | <0.0001 |
| Example 4 | Cu | 30 | 33 | 10 | — | 0.001 |
| Example 5 | Cu | 30 | 33 | 10 | — | 0.0002 |
| Example 6 | Cu | 30 | 33 | 10 | Surfactant | <0.0001 |
| Example 7 | Cu | 30 | 33 | 10 | — | 0.0003 |
| Example 8 | Cu | 30 | 33 | 10 | — | 0.002 |
| Example 9 | Ni | 30 | 33 | 10 | — | <0.0001 |
| Example 10 | Au | 30 | 33 | 10 | — | <0.0001 |
| Comparative Example 1 | Cu | 30 | 33 | 10 | — | 0.08 |
| Comparative Example 2 | Cu | 60 | 40 | 10 | — | 0.082 |
| Comparative Example 3 | Cu | 30 | 33 | 10 | — | 0.012 |
| Comparative Example 4 | Cu | 150 | 150 | 10 | — | 0.012 |
| Comparative Example 5 | Cu | 30 | 33 | 10 | — | 0.01 |

(Evaluation Method)

Figure 6:
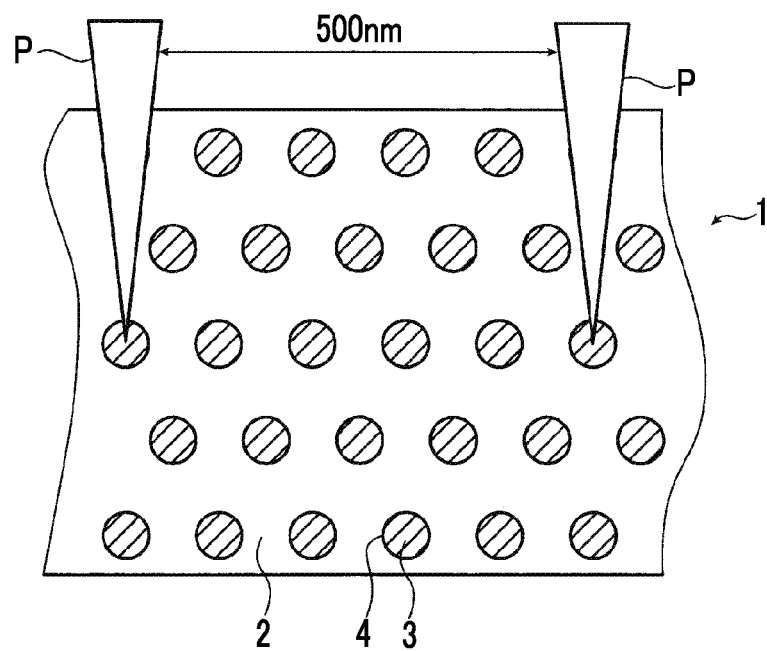
FIG. 6 is a view illustrating a method of measuring the lowest withstand voltage of an insulating substrate.

As shown in FIG. 6, the lowest withstand voltage of the insulating substrate was measured by bringing a pair of having a thickness of 3 μm on one surface of the microstructure by a sputtering method, electrically connecting the conductive paths and bringing a pair of probes P using probers (NANOPROBER NE-4000, manufactured by Hitachi High-Technologies Corporation) into contact with adjacent conductive paths, applying a predetermined voltage, measuring the current value of a current I flowing between the conductive paths with a semiconductor device analyzer (B1500A, manufactured by Agilent Technologies Japan, Ltd.), and calculating the volume resistivity based on ρ=R·A/L using an electrical resistivity R obtained from these measured values. Here, ρ represents volume resistivity, A represents the cross section area of the conductive path ($r^2\pi$), and L represents the length of the conductive path, respectively. The radius r and the length L of the conductive path were measured by cutting the anodized film at the through hole portion with FIB and then taking an image of the cross section thereof (at a magnification of 50,000 times) with FE-SEM.

TABLE 3

Third Table

| | Evaluation result | | |
|---|---|---|---|
| | Without high temperature high humidity storage treatment Lowest withstand voltage of insulating substrate [V] | With high temperature high humidity storage treatment Lowest withstand voltage of insulating substrate [V] | Conductivity of conductive path [% IACS] |
| Example 1 | 15 | 10 | 70 |
| Example 2 | 20 | — | 70 |
| Example 3 | 40 | — | 70 |
| Example 4 | 12 | — | 71 |
| Example 5 | 14 | — | 70 |
| Example 6 | 15 | 15 | 70 |
| Example 7 | 14 | — | 70 |
| Example 8 | 11 | — | 8 |
| Example 9 | 15 | — | 21 |
| Example 10 | 15 | — | 65 |
| Comparative Example 1 | 2 | — | 72 |
| Comparative Example 2 | 3 | — | 72 |
| Comparative Example 3 | 4 | — | 10 |
| Comparative Example 4 | 8 | — | 10 |
| Comparative Example 5 | 6 | — | 50 |

From the results shown in Table 1, it was found that in Examples 1 to 3 in which the average opening diameter of the through holes was changed within a range of 20 nm to 200 nm, and the average shortest distance between the through holes was changed within a range of 10 nm to 300 nm, respectively, the moisture content of the microstructure was controlled to 0.005% or less with respect to the total mass by subjecting the microstructure to the baking treatment at a temperature of 100° C. or higher for 3 hours or longer and thus the lowest withstand voltage of the insulating substrates of all Examples exhibited a high value of 10 V or higher.

In addition, it was found that Examples 1 to 10 in which the moisture content of the microstructure was controlled to 0.005% or less with respect to the total mass by subjecting the microstructure to the baking treatment at a temperature of 100° C. or higher for 3 hours or longer exhibited a significantly improvement in the lowest withstand voltage of the insulating substrate compared to Comparative Examples 1 to 5 in which the moisture content of the microstructure was higher than 0.005% with respect to the total mass by not carrying out the baking treatment or carrying out the baking treatment at a temperature of 100° C. or higher for less than 3 hours.

It was found that Example 7 in which the baking treatment was carried out in a pressure-reduced atmosphere having an oxygen concentration of 0.1% or less exhibited improvement in the lowest withstand voltage of the insulating substrate compared to Example 8 in which the baking treatment was carried out in the air atmosphere having an oxygen concentration of more than 0.1%, and further the conductivity of the conductive path was remarkably improved by 20% IACS or more.

It was found that in Example 6 in which a hydrophobic film was provided on the surface of the insulating substrate, the lowest withstand voltage of the insulating substrate was maintained at a high level before and after the high temperature high humidity storage treatment and the moisture in the air was prevented from being adsorbed onto the insulating substrate so that the withstand voltage of the insulating substrate was maintained compared to Example 1 in which a hydrophobic film was not provided on the surface of the insulating substrate.

In all Examples 1, 9 and 10 in which type of metal of the conductive path was changed, the lowest withstand voltage of the insulating substrate exhibited high values and irrespective of the type of metal of the conductive path, the withstand voltage of the insulating substrate could be improved.

EXPLANATION OF REFERENCES 1, 1a, 1b: Microstructure
2: Insulating substrate
2a: One surface
2b: The other surface
3: Conductive path
4: Through holes
5: Hydrophobic film
6: Opening diameter of through hole
7: Shortest distance connecting through holes
8: Thickness of insulating substrate
21: Multilayer wiring board
22a, 22b, 22c: Wiring board
23a, 23b, 23c, 23d Electrode
P: Probe
101, 102, 104, 105, 107, 108: Through holes
103, 106, 109: Circle

What is claimed is:

1. A microstructure comprising:
an insulating substrate having a plurality of through holes; and
conductive paths consisting of a conductive material containing metal filling the plurality of through holes,
wherein an average opening diameter of the plurality of through holes is 5 nm to 500 nm,
an average value of shortest distances connecting the through holes adjacent to each other is 10 nm to 300 nm, and
a moisture content is 0.005% or less with respect to a total mass of the microstructure.

2. The microstructure according to claim 1, wherein the insulating substrate is an aluminum anodized film.

3. The microstructure according to claim 1 that is used as an anisotropic conductive member.

4. A multilayer wiring board comprising:
the microstructure according to claim 3; and
a pair of wiring boards disposed to sandwich the microstructure and electrically connected to each other through conductive paths.

5. A semiconductor package using the multilayer wiring board according to claim 4.

6. A microstructure manufacturing method comprising:
a precursor forming step of providing a plurality of through holes having an average opening diameter of 5 nm to 500 nm in an insulating substrate such that an average value of shortest distances connecting the through holes adjacent to each other is 10 nm to 300 nm, and then filling the plurality of through holes with a conductive material containing metal and forming conductive paths to obtain a precursor; and
a baking treatment step of carrying out a baking treatment at a temperature of 100° C. or higher for 3 hours or longer after the precursor forming step to obtain a microstructure having a moisture content of 0.005% or less with respect to a total mass.

7. The microstructure manufacturing method according to claim 6,
wherein the baking treatment step is carried out in a pressure-reduced atmosphere having an oxygen concentration of 0.1% or less.

* * * * *